United States Patent
Wang et al.

(10) Patent No.: US 6,919,272 B2
(45) Date of Patent: Jul. 19, 2005

(54) METHOD FOR PATTERNING DENSELY PACKED METAL SEGMENTS IN A SEMICONDUCTOR DIE AND RELATED STRUCTURE

(75) Inventors: Tinghao F. Wang, Irvine, CA (US); Dieter Dornisch, Carlsbad, CA (US); Julia M. Wu, Las Flores, CA (US); Hadi Abdul-Ridha, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/356,447

(22) Filed: Feb. 1, 2003

(65) Prior Publication Data

US 2004/0152302 A1 Aug. 5, 2004

(51) Int. Cl.[7] ............................................. H01L 21/44
(52) U.S. Cl. ........................ 438/669; 438/671; 438/712; 438/720; 438/942; 438/945
(58) Field of Search ................................ 438/669, 670, 438/671, 673, 712, 720, 906, 942, 945; 257/750, 758

(56) References Cited

U.S. PATENT DOCUMENTS

| | | | | |
|---|---|---|---|---|
| 4,370,196 A | * | 1/1983 | Vossen et al. | 438/720 |
| 5,211,804 A | * | 5/1993 | Kobayashi | 216/70 |
| 5,387,556 A | * | 2/1995 | Xiaobing et al. | 438/695 |
| 5,397,433 A | * | 3/1995 | Gabriel | 438/713 |
| 5,702,564 A | * | 12/1997 | Shen | 438/710 |
| 6,017,826 A | * | 1/2000 | Zhou et al. | 438/720 |
| 6,214,739 B1 | * | 4/2001 | Huang et al. | 438/709 |

* cited by examiner

Primary Examiner—Maria F. Guerrero
(74) Attorney, Agent, or Firm—Farjami & Farjami LLP (57) ABSTRACT

A method of patterning a metal layer in a semiconductor die comprises forming a mask on the metal layer to define an open region and a dense region. The method further comprises etching the metal layer at a first etch rate to form a number of metal segments in the open region and etching the metal layer at a second etch rate to form a number of metal segments in the dense region, where the first etch rate is approximately equal to the second etch rate. The method further comprises performing a number of strip/passivate cycles to remove a polymer formed on sidewalls of the metal segments in the dense region. The sidewalls of the metal segments in the dense region undergo substantially no undercutting and residue is removed from the sidewalls of the metal segments in the dense region.

9 Claims, 6 Drawing Sheets

METHOD FOR PATTERNING DENSELY PACKED METAL SEGMENTS IN A SEMICONDUCTOR DIE AND RELATED STRUCTURE

BACKGROUND OF THE INVENTION

1. Field of the Invention

The present invention relates to the field of fabrication of semiconductor dies. More specifically, the invention relates to patterning interconnect metal in a semiconductor die.

2. Background Art

In semiconductor die manufacturing, interconnect metal segments are formed in interconnect metal levels of a semiconductor die to provide connectivity between various circuit elements in the semiconductor die. The interconnect metal segments can be formed in a conventional metal etch process, which utilizes a plasma dry etch technique to pattern a layer of interconnect metal, such as aluminum, to form the interconnect metal segments.

The conventional metal etch process works adequately when the thickness of the interconnect metal segments is less than 4.0 microns and the spacing aspect ratio, which is equal to the height of the interconnect metal segments divided by the space between adjacent interconnect metal segments, is generally less than 2.0. However, when the thickness of the interconnect metal segments is greater than 4.0 microns and the spacing aspect ratio is greater than 2.5, the conventional metal etch process results in undesirable undercutting on sidewalls of the interconnect metal segments and/or under-etching between adjacent interconnect metal segments.

Undercutting occurs as a result of over-etching, which is utilized in the conventional metal etch process to ensure that all residue metal is removed between adjacent interconnect metal segments. By way of background, metal etches faster in open regions of a semiconductor die, where the spacing between adjacent interconnect metal segments is relatively large and the spacing aspect ratio is generally less than 2.0, in comparison to dense regions of the semiconductor die, where the spacing aspect ratio between adjacent closely-packed interconnect metal segments is generally greater than 2.5. The different between etch rates in open and dense regions of the semiconductor die is referred to as reactive ion etch ("RIE") lag. As a result of RIE lag, a substantial amount of over-etch is required to clear out residue metal between interconnect metal segments in dense regions of the semiconductor die.

Semiconductor manufacturers have attempted to reduce undesirable undercutting by reducing the amount of over-etch in dense regions of the semiconductor die. However, reducing the amount of over-etch in dense regions of the semiconductor die can result in undesirable under-etching.

Thus, there is a need in the art for an effective method for patterning interconnect metal in dense regions of a semiconductor die.

SUMMARY OF THE INVENTION

The present invention is directed to method for patterning densely packed metal segments in a semiconductor die and related structure. The present invention addresses and resolves the need in the art for an effective method for patterning interconnect metal in dense regions of a semiconductor die.

According to one exemplary embodiment, a method of patterning a metal layer in a semiconductor die comprises a step of forming a mask on a metal layer of the semiconductor die, where the mask defines an open region and a dense region of the semiconductor die. The method further comprises etching the metal layer at a first etch rate to form a number of metal segments in the open region and etching the metal layer at a second etch rate to form a number of metal segments in the dense region, where the first etch rate is approximately equal to the second etch rate. The first etch rate may be controlled by, for example, increasing an etch inhibitor in an etchant. For example, the first etch rate may be decreased to cause the first etch rate to be approximately equal to the second etch rate. The etch inhibitor may be, for example, $N_2$ or CHF3.

According to this exemplary embodiment, a spacing aspect ratio in the dense region can be generally greater than approximately 2.5. The method further comprises a step of performing a number of strip/passivate cycles, for example at least three strip/passivate cycles, to remove a polymer formed on respective sidewalls of the metal segments in the dense region. According to the present invention, the respective sidewalls of the metal segments in the dense region undergo substantially no undercutting. The method further comprises a step of removing a residue formed on the respective sidewalls of the metal segments in the dense region. Other features and advantages of the present invention will become more readily apparent to those of ordinary skill in the art after reviewing the following detailed description and accompanying drawings.

DETAILED DESCRIPTION OF THE INVENTION

The present invention directed to method for patterning densely packed metal segments in a semiconductor die and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It is noted that although a semiconductor die is utilized to illustrate the present embodiment of the invention, the principles of the present invention may also be applied to non-semiconductor die structures and devices, such as micromechanical devices, microelectromechanical systems ("MEMS") devices, inductors in packages, and structures formed utilizing nanotechnology.

Figure 1:
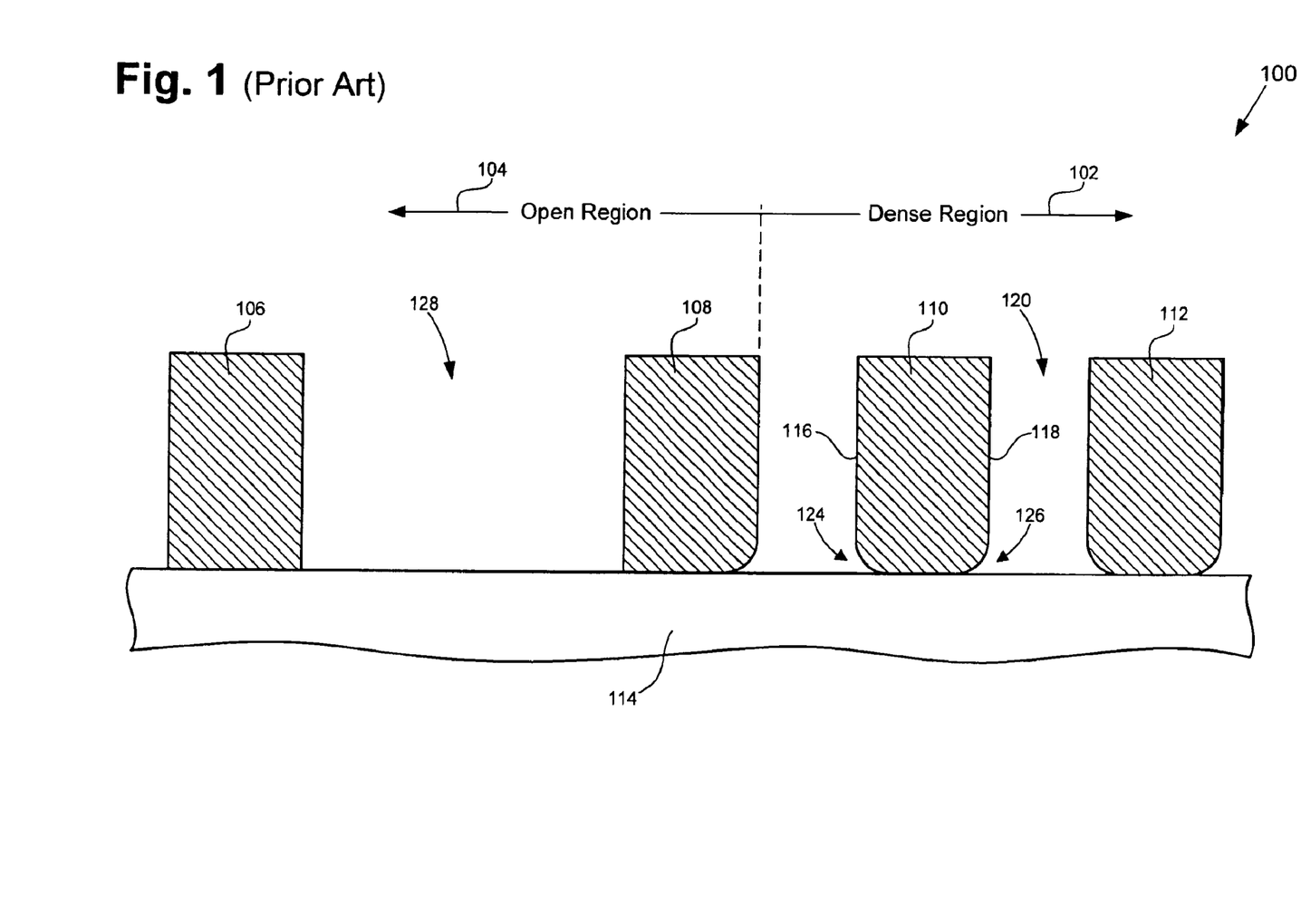
FIG. 1 illustrates a cross-sectional view of a portion of a semiconductor die including interconnect metal segments that have been formed utilizing a conventional metal etch process.

FIG. 1 shows a cross-sectional view of a portion of a semiconductor die including interconnect metal segments that have been formed utilizing a conventional metal etch process. Structure 100 includes dense region 102, where interconnect metal segments, such as interconnect metal segments 110 and 112, are densely packed, and open region 104, where interconnect metal segments, such as interconnect metal segments 106 and 108, are sparsely packed. In dense region 102, the spacing aspect ratio, which is equal to the height of the interconnect metal segments divided by the space between adjacent interconnect metal segments, is generally greater than 2.5, while in open region 104 the spacing aspect ratio is generally much less than 2.0.

As shown in FIG. 1, interconnect metal segments 106, 108, 110, and 112 are situated on dielectric 114. Dielectric 114 can be, for example, an inter-layer dielectric of a semiconductor die and can comprise silicon dioxide or other appropriate dielectric material as known in the art. Interconnect metal segments 106, 108, 110, and 112 can comprise, for example, aluminum or an aluminum alloy and may be situated in any metal level of a semiconductor die. Further shown in FIG. 1, interconnect metal segments 106 and 108 are separated by gap 128 in open region 104 and interconnect metal segments 110 and 112 are separated by gap 120 in dense region 102.

Interconnect metal segments 106, 108, 110, and 112 can be formed in a process that includes depositing a layer of interconnect metal over dielectric 114. A layer of photoresist can then be coated and patterned on the layer of interconnect metal to define closely spaced interconnect metal segments in dense region 102 and widely spaced interconnect metal segments in open region 104. Interconnect metal segments 110 and 112 in dense region 102 and interconnect metal segments 106 and 108 in open region 104 can then be formed by etching the layer of interconnect metal utilizing a conventional metal etch process.

During the conventional metal etch process, a plasma dry etch technique can be utilized, for example, to pattern the layer of interconnect metal. In the conventional metal etch process, photoresist combines with etchant to form a polymer on sidewalls of interconnect metal segments. The polymer acts as a passivant to protect the sidewalls from undesirable undercutting. However, when the aspect ratio of the spacing between adjacent interconnect metal segments is greater than approximately 2.5, e.g. in gap 120 in dense region 102, sputtered photoresist does not diffuse down the sidewalls of the interconnect metal segments sufficiently to form a polymer passivant at the bottom of the sidewalls. As a result, undesirable undercutting can occur during an over-etch step of the conventional metal etch process. As discussed above, over-etch is utilized to ensure that all remaining metal residue is removed from the gap between adjacent interconnect metal segments. For example, undercuttings 124 and 126 can occur on sidewalls 116 and 118 of interconnect metal segment 110, respectively, during the over-etch step of the conventional metal etch process.

Undercutting can become more severe when the thickness of the interconnect metal segments, such as interconnect metal segments 110 and 112 in dense region 102, is greater than approximately 4.0 microns. Although undercutting can be reduced by reducing the amount of over-etch during the over-etch step of the conventional metal etch process, reducing over-etch can cause under-etching in gaps, such as gap 120, between adjacent interconnect metal segments of dense region 102. Under-etching can cause undesirable metal residue to remain in gaps between adjacent interconnect metal segments of dense region 102.

Figure 2:
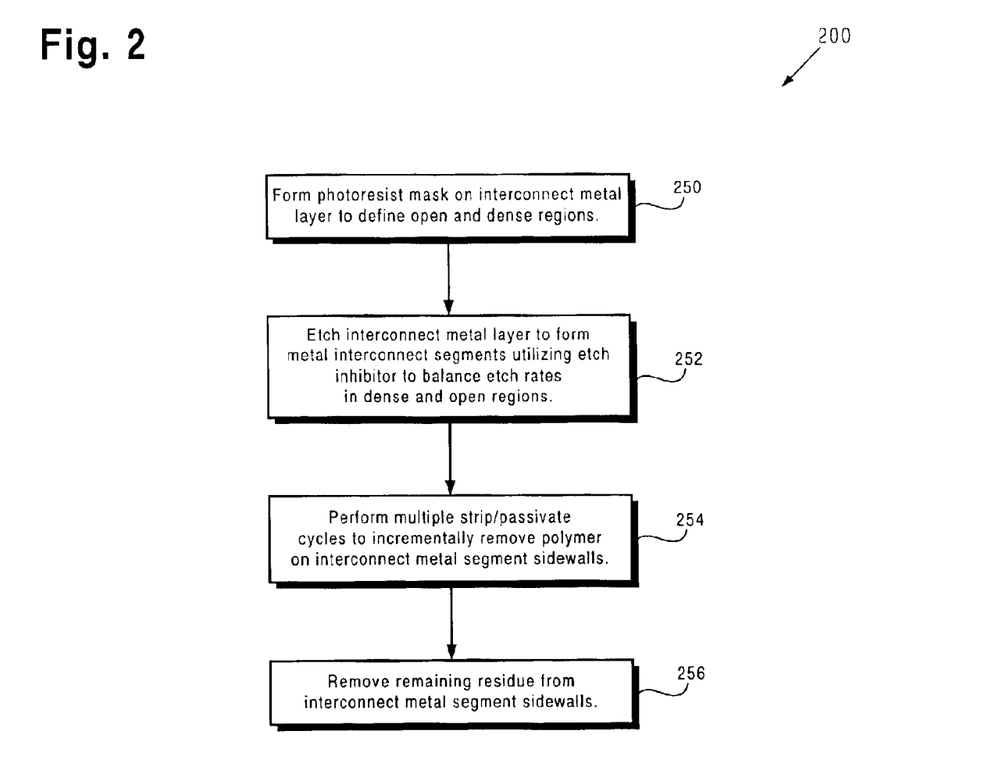
FIG. 2 shows a flow chart illustrating the steps taken to implement an embodiment of the present invention.

FIG. 2 shows a flow chart illustrating an exemplary method according to an embodiment of the present invention. Certain details and features have been left out of flow chart 200 that are apparent to a person of ordinary skill in the art. For example, a step may consist of one or more substeps or may involve specialized equipment or materials, as known in the art. While steps 250 through 256 shown in flow chart 200 are sufficient to describe one embodiment of the present invention, other embodiments of the invention may utilize steps different from those shown in flow chart 200. It is noted that the processing steps shown in flow chart 200 are performed on a wafer, which, prior to step 250, comprises a semiconductor structure having a blanket layer of interconnect metal deposited on a dielectric layer situated in a semiconductor die.

Moreover, structures 350 through 356 in FIGS. 3A through 3D illustrate the result of performing, on the semiconductor structure discussed above, steps 350 through 356 of flow chart 200, respectively. For example, structure 350 shows the semiconductor structure discussed above after processing step 250, structure 352 shows structure 350 after the processing of step 252, structure 354 shows structure 352 after the processing of step 254, and so forth.

Figure 3A:
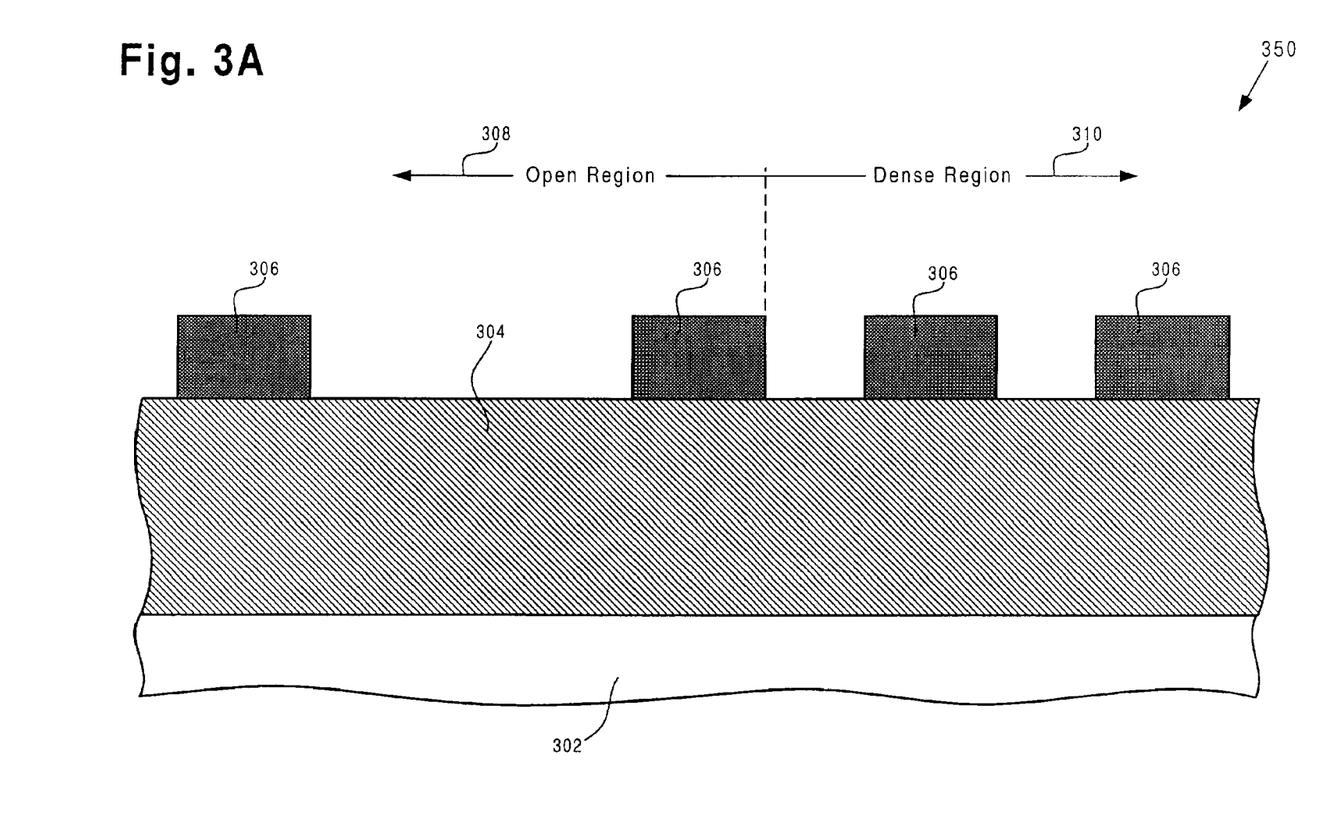
FIG. 3A illustrates cross-sectional views, which include portions of a wafer processed according to an embodiment of the invention, corresponding to certain steps of the flow chart in FIG. 2.

Referring now to FIG. 3A, structure 350 of FIG. 3A shows the structure discussed above, including an interconnect metal layer that has been deposited on a dielectric layer, after completion of step 250 of flow chart 200 in FIG. 2. In structure 350, interconnect metal layer 304 is formed on dielectric layer 302 prior to step 250. Dielectric layer 302 can be, for example, an inter-layer dielectric layer of a semiconductor die and can comprise a dielectric such as silicon dioxide or other appropriate dielectric. Interconnect metal layer 304 can be formed by depositing a layer of interconnect metal, such as aluminum or other appropriate interconnect metal, in a manner known in the art.

Continuing with step 250 in FIG. 2 and structure 350 in FIG. 3A, at step 250 of flow chart 200, photoresist mask 306 is formed on interconnect metal layer 304 to define open region 308 and dense region 310. Photoresist mask 306 can be formed by coating and patterning a layer of photoresist in a manner known in the art. Dense region 310 defines a region of a semiconductor die where interconnect metal segments are densely packed. For example, the aspect ratio of spacing between adjacent interconnect metal segments in dense region 310 can be greater than approximately 2.5. Furthermore, dense region 310 can comprise interconnect metal segments having a thickness of approximately 4.0 microns or greater. Open region 308 defines a region comprising sparsely spaced interconnect metal segments. For example, the aspect ratio of spacing between adjacent interconnect metal segments in open region 308 can be less than approximately 2.0. The result of step 250 of flow chart 200 is illustrated by structure 350 in FIG. 3A.

Figure 3B:
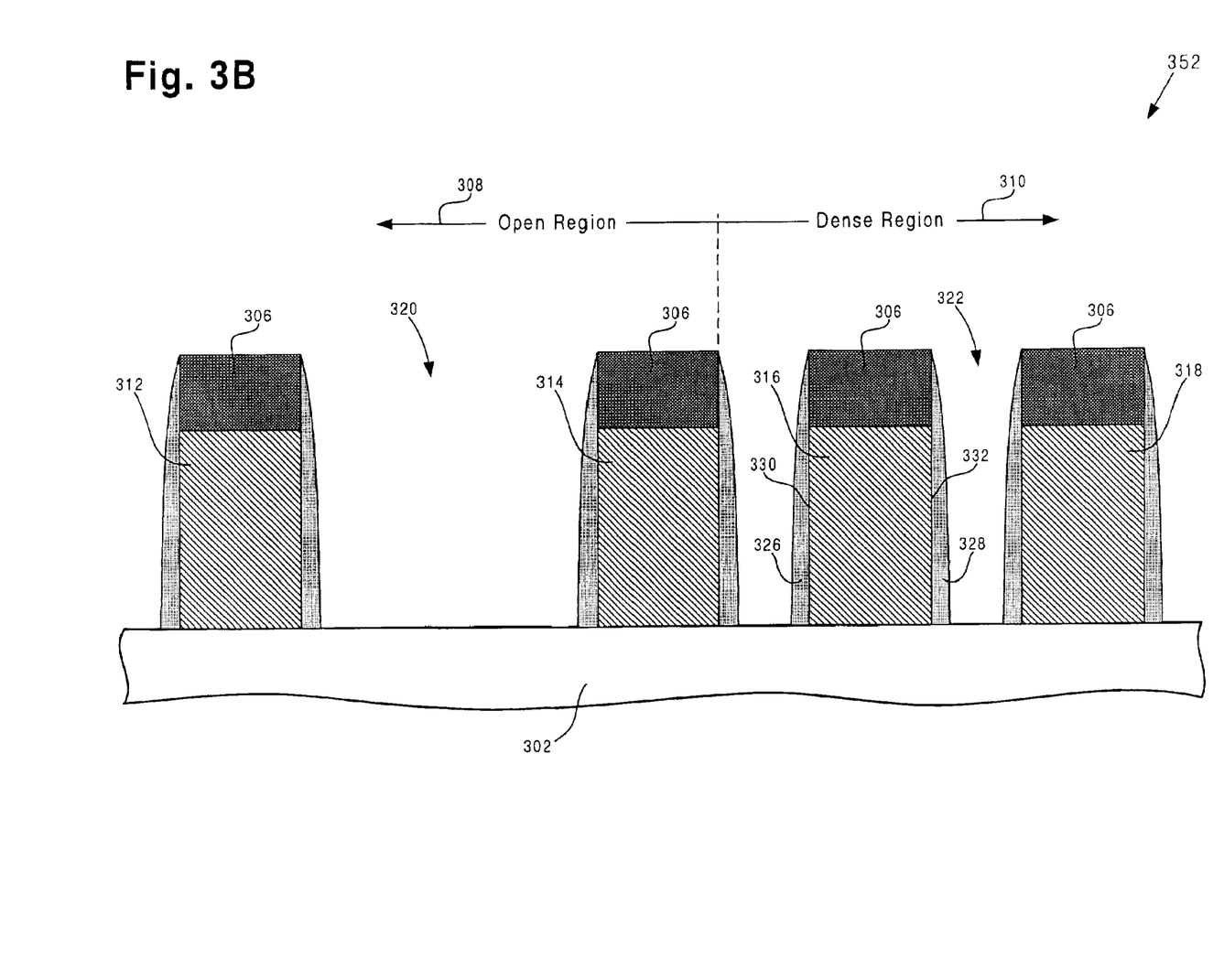
FIG. 3B illustrates cross-sectional views, which include portions of a wafer processed according to an embodiment of the invention, corresponding to certain steps of the flow chart in FIG. 2.

Referring to step 252 in FIG. 2 and structure 352 in FIG. 3B, at step 252 of flow chart 200, interconnect metal layer 304 is etched to form interconnect metal segments 312, 314, 316, and 318 by utilizing an etch inhibitor to balance etch rates in open region 308 and dense region 310. In the present embodiment, the chemistry balance of an etchant comprising, for example, chlorine ("Cl"), boron tri-chloride ("$BCl_3$"), and nitrogen ("$N_2$") can be altered by controlling the amount of nitrogen, which is an etch inhibitor, in the etchant. For example, the amount of nitrogen in the etchant can be appropriately increased to achieve approximately equal etch rates in open region 308 and in dense region 310. In other words, the amount of etch inhibitor in the etchant discussed above can be appropriately controlled to minimize the difference in etch rates between open region 308 and dense region 310. In one embodiment, the amount of nitrogen in the etchant can be appropriately increased to achieve an etch rate in dense region 310 that is slightly faster than an etch rate in open region 308. In one embodiment, CHF3 can be utilized as an etch inhibitor in place of nitrogen in the above etchant to appropriately balance etch rates in open region 308 and in dense region 310.

In the present embodiment, interconnect metal segments 312, 314, 316, and 318 can be formed by etching interconnect metal layer 304 utilizing an etchant discussed above, i.e. an etching comprising Cl, $BCl_3$, and $N_2$, where the amount of nitrogen has been appropriately increased to achieve approximately equal etch rates in open region 308 and in dense region 310. By utilizing an etchant having an appropriately increased etch inhibitor as discussed above, the etch rate in gap 320 in open region 308 can be, for example, approximately equal to the etch rate in gap 322 in dense region 310.

As discussed above, as a result of RIE lag, metal in open regions, such as open region 308, etches faster than in dense regions, such as dense region 310. As a result, a conventional metal etch process requires a substantial amount of over-etch in order to clear out residue metal between densely packed interconnect metal segments, such as interconnect metal segments 316 and 318. The substantial amount of over-etch required in the conventional metal etch process causes undesirable undercutting, such as undercuttings 124 and 126 in FIG. 1, on sidewalls of interconnect metal segments. By appropriately increasing the amount of etch inhibitor, such as nitrogen, in the etchant, the etch rate can be appropriately decreased in open region 308 to achieve an approximately equal etch rate in open region 308 and dense region 310. Consequently, the present invention advantageously achieves a metal etch process that does not require a substantial amount of over-etch to remove residue metal between interconnect metal segments in dense region 310. As a result, the present invention advantageously achieves interconnect metal segments, such as interconnect metal segments 316 and 318 in dense region 310, that exhibit substantially no undercutting, such as undercuttings 124 and 126 in FIG. 1, on sidewalls of interconnect metal segments.

As a result of the etch process discussed above, thick polymers, such as polymers 326 and 328, are formed on sidewalls, such as sidewalls 330 and 332, respectively, of interconnect metal segments, such as interconnect metal segment 316. Polymers 326 and 328 act as passivants to protect the sidewalls of interconnect metal segments from being inappropriately etched during the metal etch process. Polymers 326 and 328 can comprise a mixture of photoresist and etch by-products, which polymerize on sidewalls 330 and 332, respectively, of interconnect metal segment 316. Polymers 326 and 328 can comprise carbon, silicon dioxide ("$SiO_2$"), and aluminum chloride ("$AlCl_x$"), for example. The result of step 252 of flow chart 200 is illustrated by structure 352 in FIG. 3B. It is noted that only sidewalls 330 and 332 and polymers 326 and 328 are specifically discussed in FIG. 3B to preserve brevity. It is also noted that although only interconnect metal segments 312 and 314 in open region 308 and interconnect metal segments 316 and 318 in dense region 310 are shown in FIG. 3B to preserve brevity, open region 308 and dense region 310 can include a large number of respective interconnect metal segments.

Figure 3C:
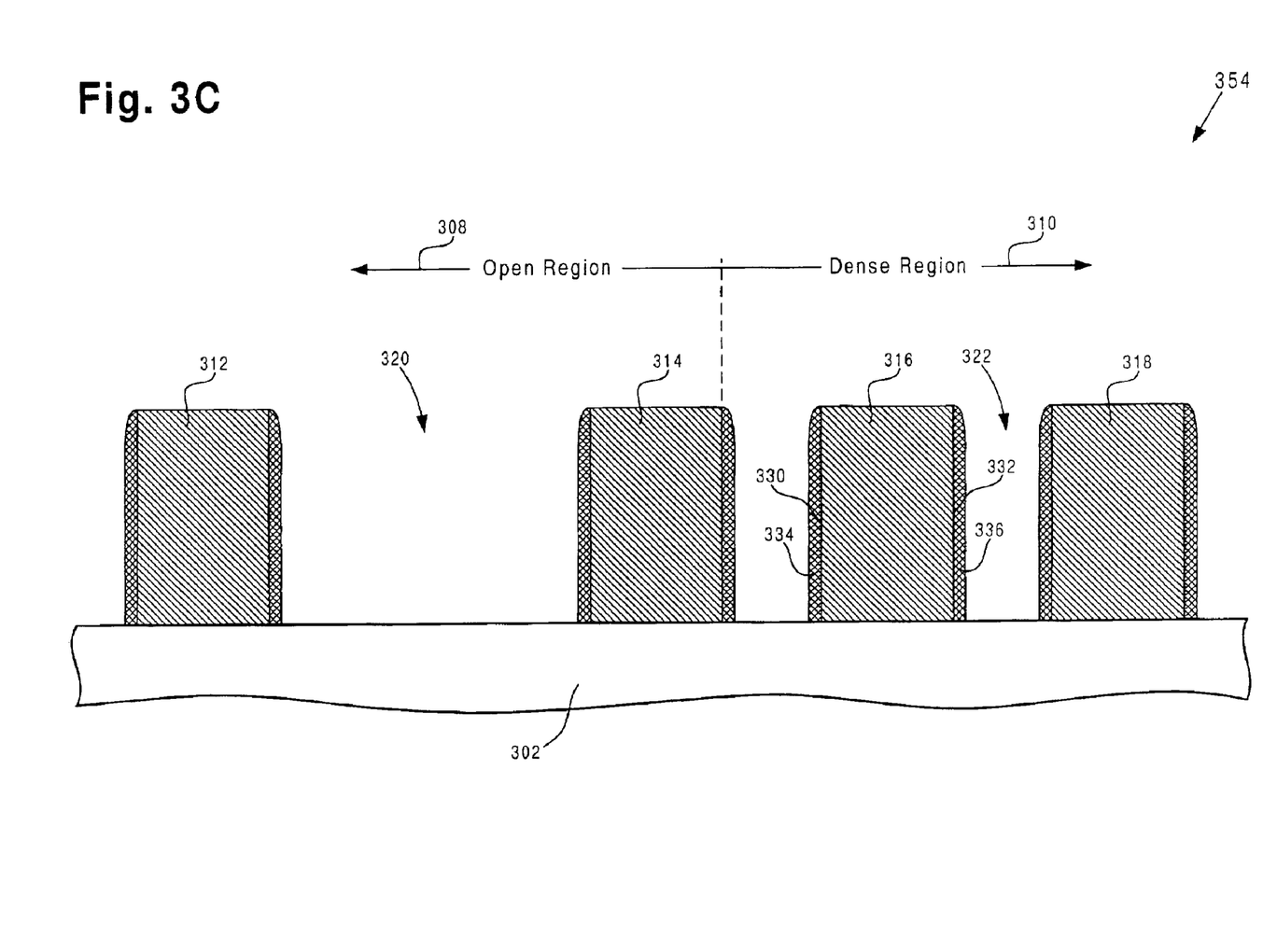
FIG. 3C illustrates cross-sectional views, which include portions of a wafer processed according to an embodiment of the invention, corresponding to certain steps of the flow chart in FIG. 2.

Referring to step 254 in FIG. 2 and structure 354 in FIG. 3C, at step 254 of flow chart 200, multiple strip/passivate cycles are performed to incrementally remove polymers, such as polymers 326 and 328, from sidewalls, such as sidewalls 330 and 332, of interconnect metal segments, such as interconnect metal segment 316 and 318, respectively. Each strip/passivate cycle utilized in the present invention comprises a two-step process. In a first strip step, portions of polymers 326 and 328 on sidewalls 330 and 332, respectively, of interconnect metal segment 316 are removed by utilizing an oxygen strip, for example. In a second passivation step of the two-step process, water vapor, for example, is utilized to passivate remaining portions of polymers 326 and 328 on sidewalls 330 and 332, respectively.

As discussed above, polymers 326 and 328 can comprise carbon, silicon dioxide, and aluminum chloride. During the second passivation step discussed above, water vapor is utilized to passivate the sidewalls of interconnect metal segments by replacing chlorine, which is corrosive, and forming aluminum oxide ("$Al(OH)_x$") on the interconnect metal segment sidewalls. However, because of the thickness of polymers 326 and 328, chlorine in polymers 326 and 328 cannot be replaced in a single strip/passivate cycle. Thus, in the present embodiment, three strip/passivate cycles are utilized to remove substantially all of the chlorine in polymers 326 and 328. In other embodiments, a greater or fewer number of strip/passivate cycles may be utilized to remove substantially all of the chlorine in polymers 326 and 328 from sidewalls 330 and 332, respectively, of interconnect metal segment 316.

In the present embodiment, by performing three strip/passivate cycles, substantially all of the chlorine in polymers 326 and 328 situated on sidewalls 320 and 332, respectively, can be removed. Additionally, carbon can also be substantially removed from polymers 326 and 328 by utilizing three strip/passivate cycles. As a result of performing three strip/passivate cycles discussed above, residues 334 and 336 remain on sidewalls 330 and 332 of interconnect metal segment 316. Residues 334 and 336 can comprise silicon dioxide and aluminum oxide or $Al(OH)_x$, for example. The result of step 254 of flow chart 200 is illustrated by structure 354 in FIG. 3C. It is noted that only sidewalls 330 and 332 and residues 334 and 336 were specifically discussed in relation to FIG. 3C to preserve brevity.

Figure 3D:
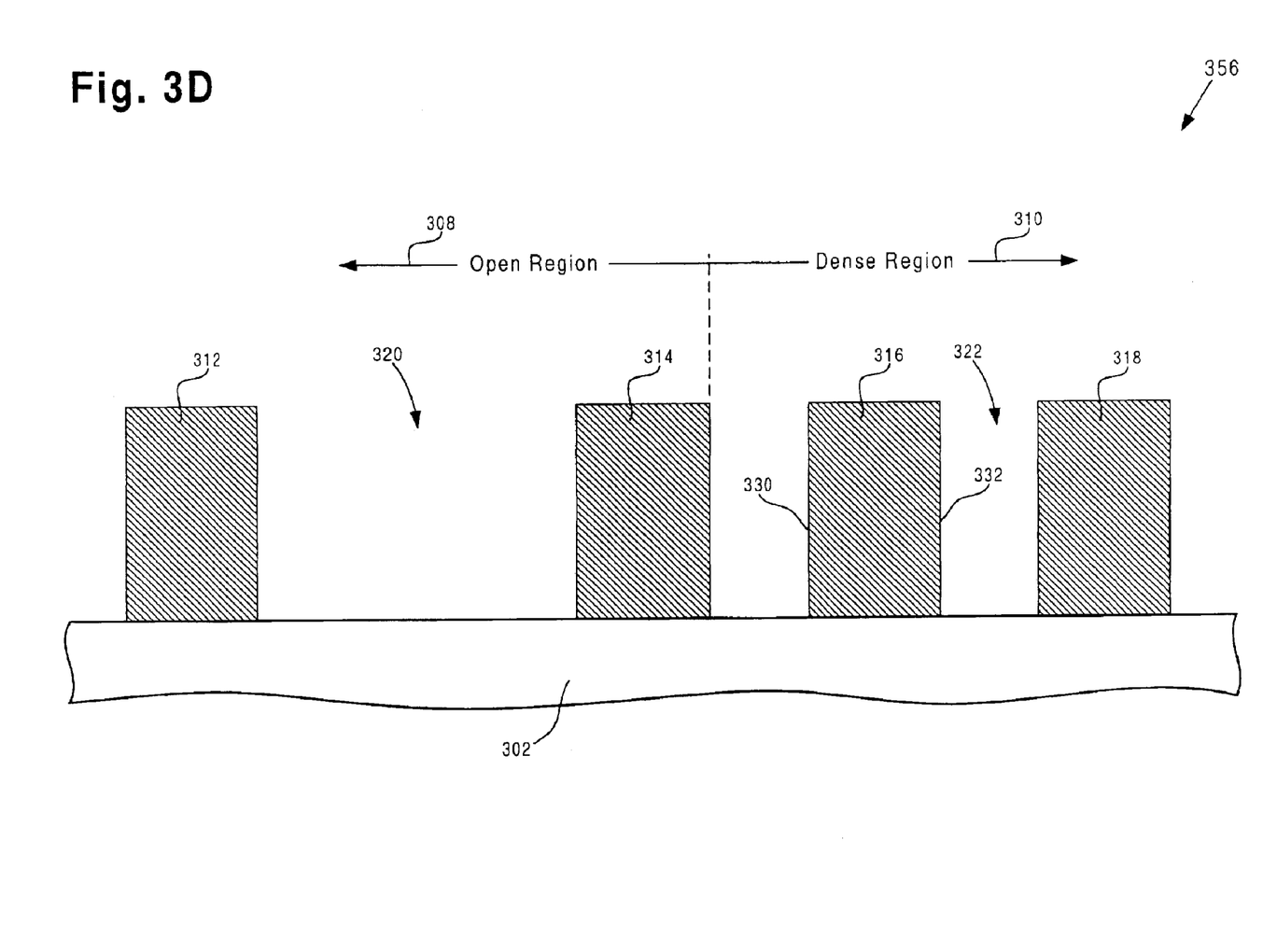
FIG. 3D illustrates cross-sectional views, which include portions of a wafer processed according to an embodiment of the invention, corresponding to certain steps of the flow chart in FIG. 2.

Referring to step 256 in FIG. 2 and structure 356 in FIG. 3D, at step 254 of flow chart 200, residues 334 and 336 are removed from sidewalls 330 and 332, respectively, of interconnect metal segment 316. Residues 334 and 336 can be removed from sidewalls 330 and 332, respectively, of interconnect metal segment 316 by utilizing an NH4F wet etch chemistry or other appropriate etch chemistry. In one embodiment, residues 334 and 336 can be removed utilizing an RNH3F etch chemistry, where "R" comprises an organic material that is combined with NH3F. Thus, as a result of the etch process discussed above, residues 334 and 336 are effectively removed from sidewalls 330 and 332, respectively, of interconnect metal segment 316. The result of step 256 of flow chart 200 is illustrated by structure 356 in FIG. 3D. It is noted that only metal segment 316, sidewalls 330 and 332, and residues 334 and 336 were specifically discussed in relation to FIG. 3D to preserve brevity.

Thus, as a result of the metal etch process discussed above, the present invention advantageously achieves interconnect metal segments in dense region of a semiconductor die, where the sidewalls of the interconnect metal segments exhibit substantially no undercutting. In constrast, a conventional metal etch process results in undesirable undercuttings 124 and 126 on sidewalls 116 and 118, respectively, of interconnect metal segment 110 in dense region 102 in FIG. 1. Furthermore, by appropriately controlling respective etch rates in open region 308 and dense region 310 of a semiconductor die, the present invention advantageously prevents undesirable under-etching of interconnect metal segments in open region 308 and dense region 310 of the semiconductor die. Additionally, the present invention advantageously achieves interconnect metal segments in a dense region of a semiconductor die having sidewalls that are substantially free of polymers or residues.

It is appreciated by the above detailed description that the invention provides method for patterning densely packed metal segments in a semiconductor die and related structure. Furthermore, the method of the present invention achieves substantially no undercutting on sidewalls of interconnect metal segments formed in the densely packed region of the semiconductor die. From the above description of the invention it is manifest that various techniques can be used for implementing the concepts of the present invention without departing from its scope. Moreover, while the invention has been described with specific reference to certain embodiments, a person of ordinary skills in the art would appreciate that changes can be made in form and detail without departing from the spirit and the scope of the invention. For example, the concepts of the present invention can be applied to non-semiconductor die structures and devices, such as micromechanical devices, MEMS devices, inductors in packages, and structures formed utilizing nano-technology. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method for patterning densely packed metal segments in a semiconductor die and related structure have been described.

What is claimed is:

1. A method of patterning a metal layer in a semiconductor die, said method comprising steps of:

forming a mask on said metal layer of said semiconductor die, said mask defining an open region and a dense region of said semiconductor die;

etching said metal layer at a first etch rate to form a first plurality of metal segments in said open region and etching said metal layer at a second etch rate to form a second plurality of metal segments in said dense region, wherein said etching is performed by using an etch inhibitor selected from the group consisting of N2 and CHF3, and wherein said etching is performed without undercutting said second plurality of metal segments;

increasing an amount of said etch inhibitor such that said first etch rate is approximately equal to said second etch rate;

performing a plurality of strip/passivate cycles to remove a polymer formed on respective sidewalls of said second plurality of metal segments.

2. The method of claim 1 wherein a first spacing aspect ratio in said open region is substantially less than a second spacing aspect ratio in said dense region.

3. The method of claim 1 wherein a first spacing aspect ratio in said open region is less than 2.0 and wherein a second spacing aspect ratio in said dense region is greater than 2.5.

4. The method of claim 1 further comprising a step of removing a residue from said respective sidewalls of said second plurality of metal segments.

5. The method of claim 1 wherein said step of performing a plurality of strip/passivate cycles comprises performing at least three strip/passivate cycles.

6. The method of claim 1 wherein a thickness of said metal layer is greater than approximately 4.0 microns.

7. A method of patterning a metal layer in a semiconductor die, said method comprising steps of:

forming a mask on said metal layer of said semiconductor die, said mask defining an open region and a dense region of said semiconductor die;

etching said metal layer at a first etch rate to form a first metal segment in said open region and etching said metal layer at a second etch rate to form a second metal segment and a third metal segment in said dense region, wherein said etching is performed by using an etch inhibitor selected from the group consisting of N2 and CHF3, and wherein said etching is performed without undercutting said second and third metal segments;

increasing an amount of said etch inhibitor such that said first etch rate is approximately equal to said second etch rate;

performing a plurality of strip/passivate cycles to remove a polymer formed on a sidewall of said second metal segment, said plurality of strip/passivate cycles causing a residue to be formed on said sidewall of said second metal segment;

removing said residue from said sidewall of said second metal segment.

8. The method of claim 7 wherein a first spacing aspect ratio in said open region is substantially less than a second spacing aspect ratio in said dense region.

9. The method of claim 7 wherein a first spacing aspect ratio in said open region is less than 2.0 and wherein a second spacing aspect ratio in said dense region is greater than 2.5.

* * * * *